(12) United States Patent
Nagashima

(10) Patent No.: US 7,199,596 B2
(45) Date of Patent: Apr. 3, 2007

(54) MANUAL TESTING INSTRUMENT

(75) Inventor: Masanori Nagashima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/294,577

(22) Filed: Dec. 6, 2005

(65) Prior Publication Data
US 2006/0084290 A1 Apr. 20, 2006

Related U.S. Application Data

(63) Continuation of application No. PCT/JP04/06305, filed on Apr. 30, 2004.

(51) Int. Cl.
G01R 31/26 (2006.01)
G01R 31/02 (2006.01)
H01R 33/76 (2006.01)

(52) U.S. Cl. ............ 324/755; 324/758; 324/757; 324/158.1; 439/169

(58) Field of Classification Search ............ 324/755
See application file for complete search history.

(56) References Cited

U.S. PATENT DOCUMENTS 4,498,232 A * 2/1985 Ertl .................. 29/741
4,887,969 A * 12/1989 Abe .................. 439/73
4,940,935 A * 7/1990 Riley ................ 324/755

FOREIGN PATENT DOCUMENTS

JP 2003-243117 * 8/2003

* cited by examiner

Primary Examiner—Vinh Nguyen
Assistant Examiner—Emily Y Chan
(74) Attorney, Agent, or Firm—Posz Law Group, PLC

(57) ABSTRACT

A manual testing instrument 1 is configured by an IC device holding member 2 mounted on a socket guide 6 in a removable way and capable of regulating a position of an IC device 7 in the planar direction with respect to connection terminals of a socket 51; and a height regulating device 3, a position of which is variable in the height direction, having a contact member 31 for contacting an upper surface of the IC device 7 and regulating a position of the IC device 7 in the height direction. A position of the contact member 31 in the height direction can be changed by combination of a block 35 formed with a plurality of grooves 351 having different depths and a regulating member 34 formed with an arm portion 342 to fit in a groove 351 on the block 35.

7 Claims, 5 Drawing Sheets

MANUAL TESTING INSTRUMENT

CROSS REFERENCE TO RELATED APPLICATION

This application is a CON of PCT/JP04/06305, filed Apr. 30, 2004 which is hereby incorporated by reference in its entirety.

TECHNICAL FIELD

The present invention relates to an instrument for testing an electronic device, such as an IC device, manually.

BACKGROUND ART

As a kind of testing apparatuses for testing an IC device and other electronic devices, there is known an electronic device testing apparatus for conveying an IC device to on a test head, pressing the IC device against a socket of the test head by a pusher driven by a pusher driving device, and bringing external terminals of the IC device electrically contact with connecting terminals of the socket to conduct a test on the IC device by an electric signal from the test head, and classifying to at least good chips and defective chips in accordance with the test results.

The electronic device testing apparatus is useful for automatically testing a large number of IC devices as completed products in a short time, however, on a stage that the IC devices are prototypes, a small number of IC devices are manually tested by using the test head of the electronic device testing apparatus to debug based on the test results.

In such manual testing, a manual testing instrument 8 (hereinafter, referred to as "a testing instrument 8") as shown in FIG. 4 and FIG. 5 is conventionally used. In this testing instrument 8, a concave shaped device holder 83 is formed on a lower surface side of a body portion 81. After holding an IC device 7 in the device holder 83, a fixing plate 82 formed with an opening portion 821 at its center portion is attached to around the device holder 83, and the IC device 7 is fixed to the body portion 81 in a state that external terminals thereof are exposed from the opening portion 821 of the fixing plate 82. Then, by penetrating knurled screws 4 into holes 84 of the body portion 81 and screwing with screw holes 62 of a socket guide 6 provided around a socket 51 on a socket board 5, the external terminals of the IC device 7 are connected to probe pins of the socket 51 and a test is conducted on the IC device 7.

In the testing instrument 8, the device holder 83 has a size (length, width and depth) corresponding to a shape of the IC device 7, so that the external terminals of the IC device 7 are surely connected to the probe pins of the socket 51, and the fixing plate 82 has an opening portion 821 having a shape corresponding to an arrangement of the external terminals of the IC device 7. Accordingly, when testing an IC device 7 of a different shape, the device holder 83 and the fixing plate 82, that is, the entire testing instrument 8 has to be replaced.

When there are many kinds of IC devices 7, the number of testing instruments 8 naturally becomes large, the cost increases, it is necessary to chose from the testing instruments 8 in accordance with the many kinds of the IC devices 7, and the test operation becomes cumbersome.

DISCLOSURE OF THE INVENTION

The present invention was made in consideration of the above circumstances and has as an object thereof to provide a manual testing instrument capable of dealing with different kinds of electronic devices.

To attain the above object, the first invention provided by the present invention provides a manual testing instrument for bringing external terminals of an electronic device contact a contact portion of an electronic device testing apparatus, comprising a planar position regulating portion capable of regulating a position in a planar direction of the electronic device with respect to the contact portion; and a height regulating portion having a contact member for contacting an upper surface of the electronic device and capable of regulating a position in the height direction of the electronic device by the contact member; wherein a position of the contact member of the height regulating portion can be changed in the height direction (the invention 1).

A second invention of the present invention provides a manual testing instrument for bringing external terminals of an electronic device contact connection terminals provided to a socket of an electronic device testing apparatus, comprising a planar position regulating portion mounted in a removable way on the socket and/or a guide of the socket and capable of regulating a position in the planar direction of the electronic device with respect to the connection terminals of the socket; and a height regulating portion provided on an opposite side of the socket on the planar position regulating portion and capable of regulating a position of the electronic device in the height direction; wherein the height regulating portion comprises a contact member for contacting an upper surface of the electronic device and a height variable member capable of changing a position of the contact member in the height direction (the invention 2).

In the above inventions (inventions 1 and 2), a position of an electronic device in the planar direction can be regulated by the planar position regulating portion, and by changing a position in the height direction of the contact member for contacting an upper surface of the electronic device, it is possible to deal with electronic devices having different thicknesses and a manual test can be conducted on the electronic devices. Also, by configuring the planar position regulation portion and the height regulation portion to be separate bodies, even electronic devices having different sizes in the planar direction can be dealt with only by replacing the planar position regulating portion and it is not necessary to replace the entire manual testing instrument.

In the above invention (the invention 2), the height variable member may comprise a regulating member for regulating a position of the contact member in the height direction and a block provided with contact portions having different heights for contacting a part of the regulating member; and a position of the regulating member may be variable in the height direction of the regulating member in accordance with a contact position with respect to the contact portion of the block (the invention 3).

According to the above invention (the invention 3), a position of the contact member in the height direction can be changed with a simple configuration.

In the above invention (the invention 3), the block may be formed with a plurality of grooves having different depths, and bottom surfaces of the grooves may form the contact portion; and the regulating member may be formed with an arm portion to fit in the grooves on the block (the invention 4).

According to the above invention (the invention 4), as a result that the arm portion of the regulating member fits in the groove of the block, positions of the regulating member and thus the contact member in the height direction can be surely changed and maintained.

In the above invention (the invention 4), grooves of the block may be formed radially in the plane view, and the regulating member may be provided to be able to rotate on the center of the grooves formed radially in the plane view (the invention 5).

According to the above invention (invention 5), by rotating the regulating member, positions of the regulating member and thus the contact member in the height direction can be easily changed.

In the above invention (the invention 5), preferably, the center portion of the regulating member is an operation portion for rotating the regulating member (the invention 6).

According to the above invention (invention 6), by rotating the operating portion, positions of the regulating member and thus the contact member in the height direction can be easily changed.

In the above inventions (the inventions 3 to 6), preferably, the contact member is biased to the regulating member by an elastic body and, thereby, the regulating member is biased to the contact portion of the block (the invention 7).

According to the above invention (the invention 7), a play between the contact member and the regulating member and a play between the regulating member and the contact portion of the block are eliminated, as a result a position of the contact member in the height direction can be surely regulated.

In the above invention (the invention 7), preferably, the regulating member can be separated from the contact portion of the block by being pressed to the contact member side against biasing by the elastic body, and a position of the regulating member in the height direction can be changed (the invention 8).

According to the above invention (the invention 8), positions of the regulating member and thus the contact member in the height direction can be easily and surely changed and maintained.

In the above inventions (the inventions 2 to 8), preferably, the height regulating portion further comprises a guide member for guiding the contact member (the invention 9).

According to the above invention (the invention 9), the contact member, a position of which is variable in the height direction, can be surely guided and maintained.

In the above inventions (the inventions 7 and 8), preferably, the height regulating portion comprises a first guide member to be mounted on the planar position regulating portion for guiding the contact member, and a second guide member provided on the opposite side of the planar position regulating portion of the first guide member; and the contact member is formed with a flange, and the elastic body is provided between the flange of the contact member and the first guide member.

According to the above invention (the invention 10), the contact member, a position of which is variable in the height direction, can be surely guided and maintained, the contact member can be biased to the regulating member by a simple configuration, and assembling of the height regulating portion is easy.

BEST MODE FOR CARRYING OUT THE INVENTION

Below, an embodiment of the present invention will be explained based on the drawings.

Figure 1:
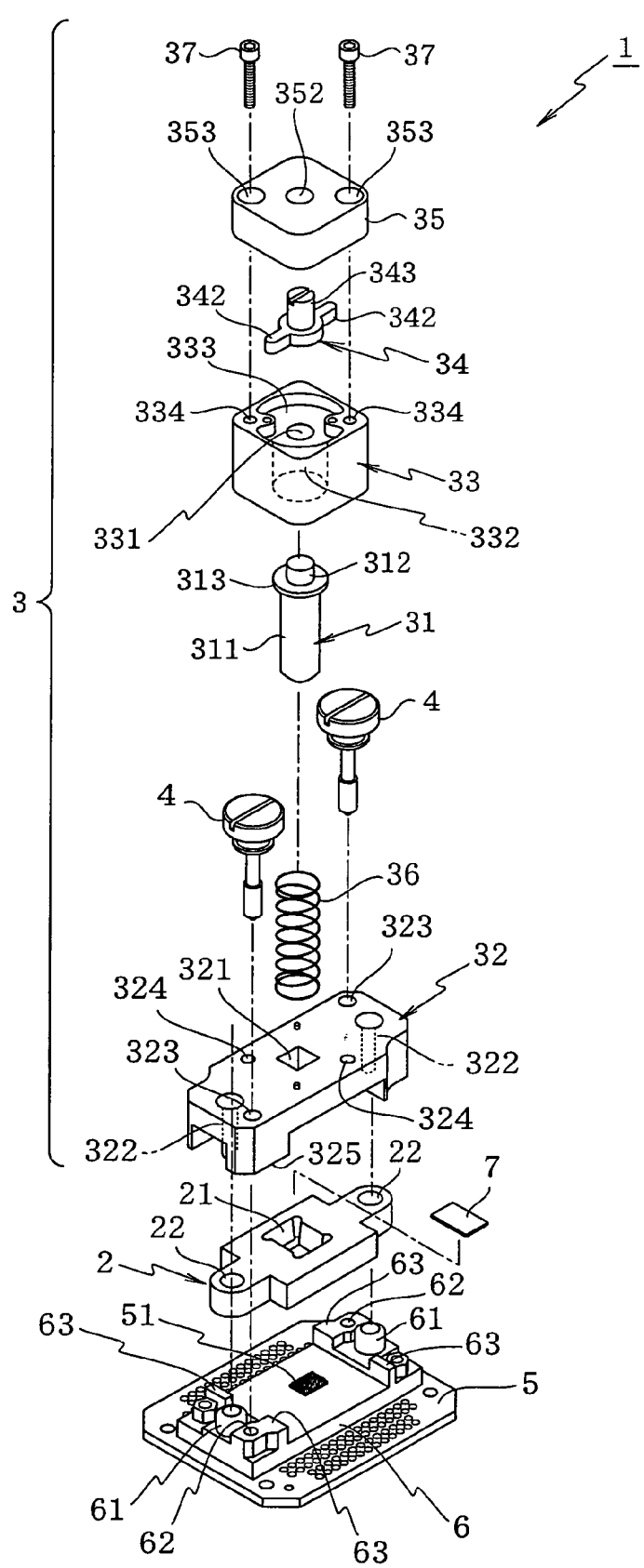
FIG. 1 is a disassembled perspective view of a manual testing instrument according to an embodiment of the present invention.

As shown in FIG. 1, a manual testing instrument 1 (hereinafter, referred to as "testing instrument 1") according to the present embodiment comprises a device holding member 2 (an example of the planar position regulating portion in the present invention) for holding an IC device 7 (an example of an electronic device in the present invention, having a rectangular shape in the plane view) and a height regulating device 3 for regulating a position of the IC device 7 in the height direction.

The device holding member 2 as a whole has an approximate plate shape wherein four corner portions are notched. At the center portion of the device holding member 2, a device holding portion 21 formed by a through hole having an approximately rectangular shape in the plane view, and both end portions of the device holding member 2 are formed with through holes 22 and 22 to which later explained guide bushes 61 of a socket guide 6 are inserted.

The device holding portion 21 of the device holding member 2 has four inner walls on which four side surfaces of the IC device 7 closely fit. An upper portion of the inner walls is slightly widened, so that the IC device 7 is put therein easily.

Since the device holding portion 21 does not support the IC device 7 by using lower surface edge portions (the rim not formed with an external terminal) of the IC device 7, it is possible to deal with an IC device 7 having a small edge portion area without any difficulty.

The height regulating device 3 comprises a contact member 31 for contacting an upper surface of the IC device 7 held in the device holding member 2, a lower guide 32 for guiding a lower portion of the contact member 31, an upper guide 33 for guiding an upper portion of the contact member 31, a regulating member 34 for regulating a position of the contact member 31 in the height direction, a block 35 for determining a position of the regulating member 34 in the height direction, and a coil spring 36 for biasing the contact member 31.

The contact member 31 is composed of a quadratic prism shaped body portion 311, a columnar shaped boss 312 formed on the upper end portion, and a flange 313 formed between the body portion 311 and the boss 312.

The lower guide 32 as a whole has a shape to cover the device holding member 2 and fit in the device holding member 2. At the center portion of the lower guide 32, a guide hole 321 is formed by a rectangular through hole in the plane view, to which the body portion 311 of the contact member 31 is inserted to be guided. The lower side both end portions of the lower guide 32 are formed with guide pins 322 and 322 for being inserted to through holes 22 and 22 on the device holding member 2 and holes of later explained guide bushes 61 of a socket guide 6. Also, screw holes 324 and 324 for screwing with screws 37 and 37 for fixing the upper guide 33 and the block 35 are formed near the guide hole 321 of the lower guide 32. The both end corner portions of the lower guide 32 are formed with through holes 323 and 323 for knurled screws 4 and 4 to penetrate. The bottom surfaces of the lower guide 32 are contact surfaces 325 for contacting later explained stopper portions 63 of the socket guide 6.

The coil spring 36 is provided between the upper surface of the lower guide 32 and the flange 313 of the contact member 31. The contact member 31 is biased by an elastic force of the coil spring 36 in the opposite direction (the regulating member 34 side) of the lower guide 32.

The upper guide 33 has an approximately quadratic prism shape as a whole. At the center of the upper guide 33 is formed with a through hole 311 in a circular shape in the plane view, to which the boss 312 of the contact member 31 is inserted and guided, and the lower side of the upper guide 33 is formed with a guide hole 332 formed by a hole in a circular shape in the plane view, to which an upper portion of the contact member 31 is inserted to guide the flange portion 313 of the contact member 31. Also, an upper side of the upper guide 33 is formed a concave portion 333 having a shape of combining two fan shapes, so that the regulating member 34 fits in and rotates. Furthermore, corner portions of the upper guide 33 are formed with through holes 334 and 334 for screws 37 and 37 to penetrate.

Figure 2:
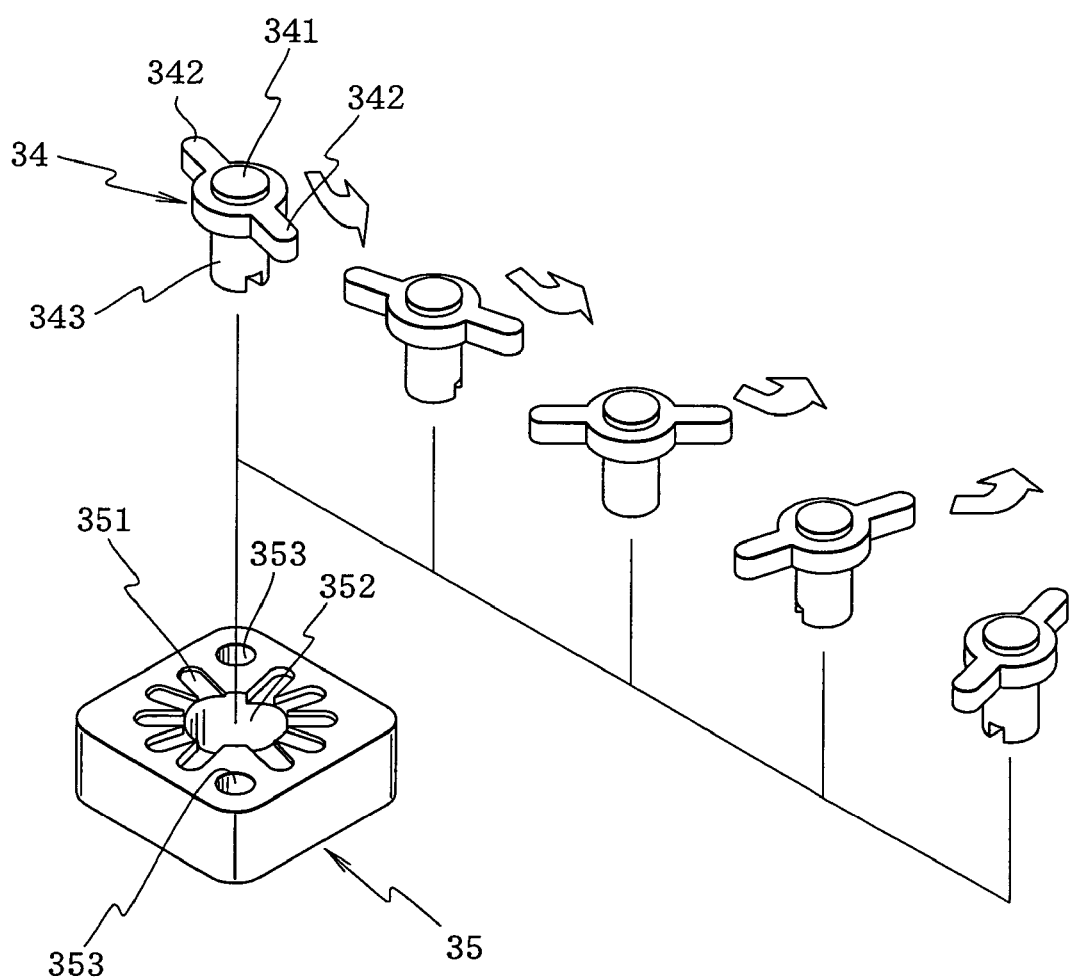
FIG. 2 is a disassembled perspective view of a part of the manual testing instrument according to the same embodiment.

As shown in FIG. 1 and FIG. 2, the regulating member 34 as a whole has an approximately T-shape in the side view. The regulating member 34 has an approximately columnar operation portion 343 on its upper portion, has at its lower end portion a columnar boss 341 able to be inserted to a through hole 331 of the upper guide 33, and an upper end portion of the operation portion 343 is formed a groove for a tip of a flat-blade screwdriver to be inserted. Between the operation portion 343 and the boss 341 of the regulating member 34, two arm portions 342 and 342 extending to the diameter direction of the regulating member 34 are formed. The two arm portions 342 and 342 are arranged on a straight line in the present embodiment.

As shown in FIG. 1 and FIG. 2, the block 35 as a whole has an approximate quadratic prism shape. At the center of the block 35, a through hole 352 having a circular shape in the plane view for the operation portion 343 of the regulating member 34 to be inserted and guided, and at corner portions of the block 35 are formed holes 353 and 353, where screw portions of the screws 37 and 37 are inserted and heads of the screws 37 and 37 latch.

On the lower side of the block 35, a plurality of grooves 351 having different depths are formed radially in the plane view. The grooves 351 are shaped to be fitted with the arm portions 342 of the regulating member 34, and grooves 351 facing to each other over the through hole 352 have the same depth. In the present embodiment, ten grooves 351 are formed, so that the grooves 351 have 5 depth levels. The depth of the grooves 351 may be suitably changed in accordance with a thickness of an IC device 7 and may be, for example, 0.8 mm, 1.0 mm, 1.2 mm, 1.4 mm and 1.6 mm.

On the upper surface of the block 35, an indicator for indicating a depth of each of the grooves 351 may be provided around the through hole 352.

To assemble the height regulating device 3, the regulating member 34 is held between the block 35 and the upper guide 33, the coil spring 36 is provided between an upper surface of the lower guide 32 and the flange 313 of the contact member 31, an upper portion of the contact member 31 is inserted to the guide hole 332 of the upper guide 33, and a lower portion of the contact member 31 is inserted to the guide hole 321 of the lower guide 32. In that state, the screws 37 and 37 are inserted to the holes 353 and 353 of the block 35 and the through holes 334 and 334 on the upper guide 33 and screwed with the screw holes 324 and 324 of the lower guide 32.

At this time, the contact member 31 is biased to the regulating member 34 side due to an elastic force of the coil spring 36, an upper end surface of the boss 312 of the contact member 31 contacts a lower end surface of the boss 341 of the regulating member 34, and the regulating member 34 is biased to the block 35 side. Also, upper surfaces of the arm portions 342 of the regulating member 34 are pressed against bottom surfaces of the grooves 351 of the block 35.

As explained above, a position of the regulating member 34 in the height direction is determined in accordance with the depths of the grooves 351 of the block 35 fitted with the arm portions 342 of the regulating member 34 and, in accordance therewith, a position of (a lower end surface of) the contact member 31 on the lower side of the regulating member 34 in the height direction is determined.

Figure 3:
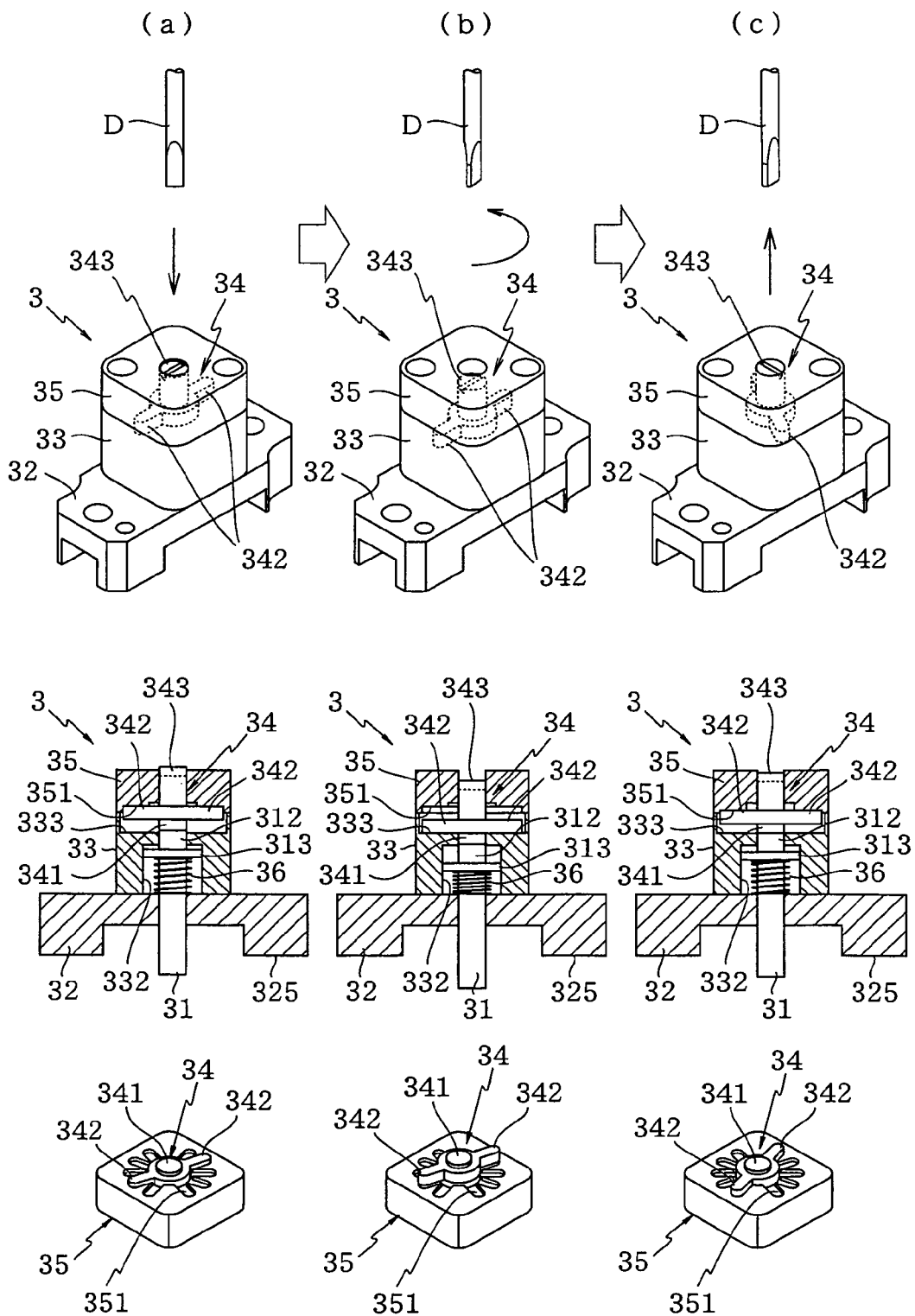
FIG. 3 is a schematic perspective view and a sectional view showing an operation of the manual testing instrument according to the same embodiment.
Figure 4:
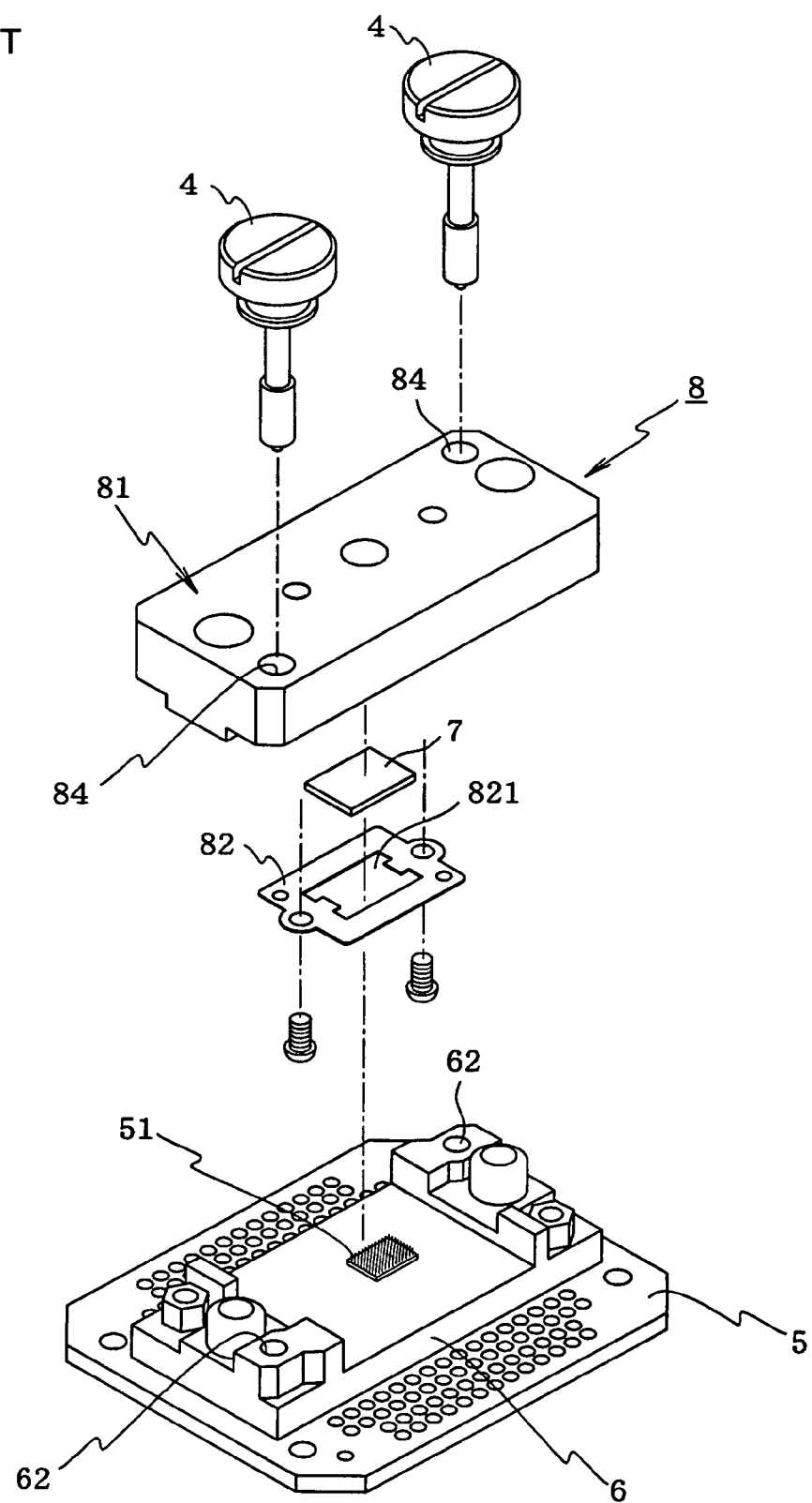
FIG. 4 is a disassembled perspective view seeing from the above of a conventional manual testing instrument.
Figure 5:
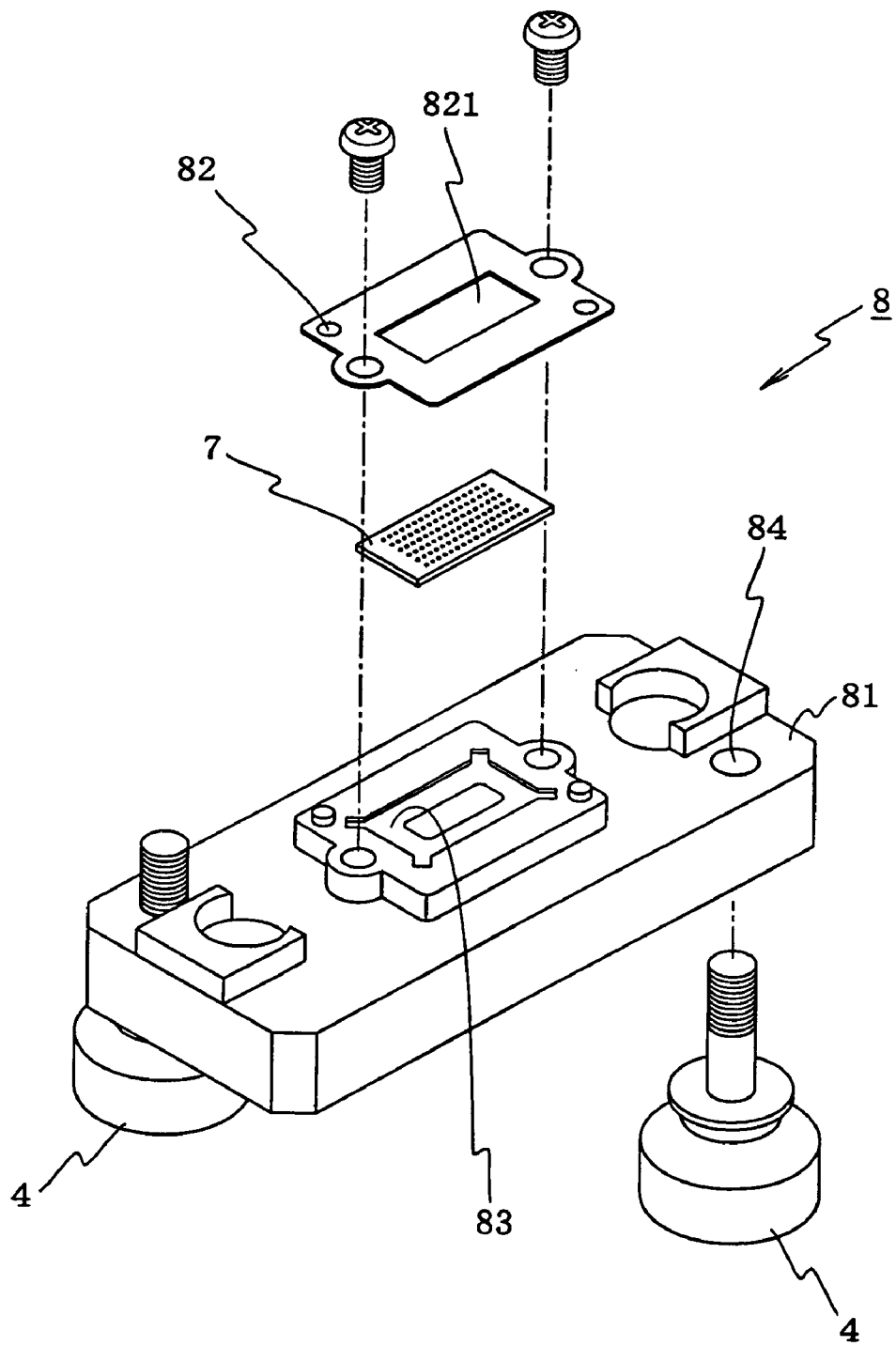
FIG. 5 is a disassembled perspective view seeing from below of the conventional manual testing instrument.

The position in the height direction of the contact member 31 is changed, as shown in FIG. 3(a) to (b), by inserting a tip of a flat-blade screwdriver D into the groove on the upper end portion of the operation portion 343 of the regulating member 34 first and pressing the regulating member 34 downward against the elastic force of the coil spring 36. Consequently, the arm portions 342 of the regulating member 34 are separated from the grooves 351 of the block 35 and the regulating member 34 becomes rotatable. Then, after rotating the operation portion 343 until the arm portions 342 of the regulating member 34 position on the lower side of the grooves 351 having a desired depth on the block 35, the downward pressing of the regulating member 34 is released as shown in FIG. 3(c), the arm portions 342 of the regulating member 34 are fit in the grooves 351 on the block 35 by the elastic force of the coil spring 36, and the upper surfaces of the arm portions 342 are brought to contact the bottom surfaces of the grooves 351.

Next, a method of conducting a manual test by using the above testing instrument 1 will be explained.

Here, an applying object of the testing instrument has the configuration as below. Namely, a socket board 5 is arranged on a test head of an electronic device testing apparatus, and a socket 51 having a plurality of probe pins are provided on the socket board 5. The probe pins are provided by the number and pitches corresponding to those of external terminals of an IC device 7 and biased upward by a spring.

A socket guide 6 is fixed around the socket 51. At the center of both end portions of the socket guide 6, guide bushes 61 and 61 to fit in through holes 22 and 22 of a device holding member 2, and holes to be fitted with guide pins 322 and 322 of a lower guide 32 are formed on the guide bushes 61 and 61. Also, stopper portions 63 and 63 for contacting with contact surfaces 325 of the lower guide 32 are formed near the guide bushes 61 and 61 on the both end portions of the socket guide 6, and the stopper portions 63 and 63 (both end corner portions of the socket guide 6) are formed with screw holes 62 and 62 to screw with knurled screws 4.

When conducting a manual test, the device holding member 2 is mounted on the socket guide 6 first. Specifically, the device holding member 2 is placed to cover the socket guide 6, so that the guide bushes 61 and 61 of the socket guide 6 are inserted to the through holes 22 and 22 of the device holding member 2. At this time, the probe pins of the socket 51 are exposed in the device holding portion 21 of the device holding member 2.

In this state, the IC device 7 is dropped into the device holding portion 21 of the device holding member 2. The IC device 7 is loaded on the probe pins, and four side surfaces of the IC device 7 closely contact four inner walls of the device holding member 2, so that a position of the IC device 7 in the planar direction (the X-axis direction and Y-axis direction) is regulated. As a result, alignment of the external terminals of the IC device 7 and the probe pins is surely attained.

Next, the height regulating device 3, which set the regulating member 34 and the contact member 31 at predetermined heights in accordance with a thickness of the IC device 7, is attached to the device holding member 2. Specifically, the lower guide 32 is put on to cover the device holding member 2, the guide pins 322 and 322 of the lower guide 3 are inserted to holes of the guide bushes 61 and 61 on the socket guide 6 via the through holes 22 and 22 on the device holding member 2. The knurled screws 4 are inserted to penetrate the through holes 323 and 323 on the lower guide 32 and screwed with the through holes 62 and 62 on the socket guide 6. Consequently, the lower end surface of the contact member 31 of the height regulating device 3 contacts the upper surface of the IC device 7 at a predetermined height, and the external terminals of the IC device 7 are pressed against the probe pins of the socket 51. Note that the lower limit position of the height regulating device 3 is regulated as a result that the contact surfaces 325 of the lower guide 32 contact the stopper portions 63 of the socket guide 6, so that the height regulating device 3 is capable of pressing the external terminals of the IC device 7 against the probe pins of the socket 51 with a suitable pressure of not damaging the IC device 7 and the probe pins.

In this state, a test is conducted by sending a testing electric signal from the testing main apparatus to the IC device 7 via the probe pins of the socket 51.

When conducting a test on other IC device 7 having a different thickness next after finishing the above test, the knurled screws 4 are unscrewed to remove the height regulating device 3 from the device holding member 2, and the IC device 7 is taken out from the device holding member 2. On the other hand, by rotating the regulating member 34 of the height regulating device 3 while pressing the same by a flat-blade screwdriver D, the regulating member 34 and the contact member 31 are set to be heights in accordance with a thickness of the next IC device 7. Procedures after that are as explained above.

As explained above, according to the testing instrument 1 of the present embodiment, it is possible to deal with IC devices 7 having different thicknesses without replacing the testing instrument 1, and a manual test can be conducted on the IC devices 7.

Note that in the case of conducting a test on other IC device 7 having a different size in the planar direction (lengths in the X-axis direction and/or Y-axis direction), it is sufficient if the device holding member 2 is replaced by one formed with a device holding portion 21 having a size corresponding to the length and width of the IC device 7, and it is not necessary to replace the entire testing instrument 1.

Namely, according to the testing instrument 1 of the present embodiment, the number of testing instruments 1 to be used may be small, so that costs required to a manual test can be reduced and cumbersome testing operations caused by replacing of testing instruments can be reduced.

The embodiments explained above are described to facilitate understanding of the present invention and is not to limit the present invention. Accordingly, respective elements disclosed in the above embodiments include all design modifications and equivalents belonging to the technical scope of the present invention.

For example, a plurality of grooves 351 having different depths are formed radially on the block 35 in the above embodiment, but the present invention is not limited to this. The grooves 351 having different depths may be formed in parallel to one another, or step-like surfaces or a slope surface may be formed on the lower side of the block 35 instead of the grooves 351.

INDUSTRIAL APPLICABILITY

As explained above, according to the manual testing instrument of the present invention, electronic devices having different thicknesses can be dealt with and manual tests can be conducted on the electronic devices. Namely, the manual testing instrument of the present invention is useful for conducting manual tests on various kinds of electronic devices.

The invention claimed is:

1. A manual testing instrument for bringing external terminals of an electronic device into contact with connection terminals provided on a socket of an electronic device testing apparatus, comprising:
    a planar position regulating portion mounted in a removable way on said socket and/or a guide of said socket and capable of regulating a position in the planar direction of the electronic device with respect to the connection terminals of said socket; and
    a height regulating portion provided on an opposite side of said socket on said planar position regulating portion and capable of regulating a position of the electronic device in the height direction, wherein
    said height regulating portion comprises a contact member for contacting an upper surface of the electronic device and a height variable member capable of changing a position of said contact member in the height direction,
    said height variable member comprises a regulating member for regulating a position of said contact member in the height direction and a block provided with contact portions having different heights for contacting a part of said regulating member; and a position of said regulating member is variable in the height direction of said regulating member in accordance with a contact position with respect to the contact portion of said block,
    said block is formed with a plurality of grooves having different depths, and bottom surfaces of said grooves forms the contact portion, and
    said regulating member is formed with an arm portion to fit in the grooves on said block.

2. The manual testing instrument as set forth in claim 1, wherein grooves of said block are formed radially in the plane view, and said regulating member is provided to be able to rotate on the center of said grooves formed radially in the plane view.

3. The manual testing instrument as set forth in claim 2, wherein the center portion of said regulating member is an operation portion for rotating said regulating member.

4. The manual testing instrument as set forth in claim 1, wherein said contact member is biased to said regulating member by an elastic body and, thereby, said regulating member is biased to the contact portion of said block.

5. The manual testing instrument as set forth in claim 4, wherein said regulating member can be separated from said contact portion of said block by being pressed to said contact member side against biasing by said elastic body, and a position of said regulating member in the height direction can be changed.

6. The manual testing instrument as set forth in claim 1, wherein said height regulating portion further comprises a guide member for guiding said contact member.

7. A manual testing instrument for bringing external terminals of an electronic device into contact with connection terminals provided on a socket of an electronic device testing apparatus, comprising:

a planar position regulating portion mounted in a removable way on said socket and/or a guide of said socket and capable of regulating a position in the planar direction of the electronic device with respect to the connection terminals of said socket; and a height regulating portion provided on an opposite side of said socket on said planar position regulating portion and capable of regulating a position of the electronic device in the height direction, wherein said height regulating portion comprises a contact member for contacting an upper surface of the electronic device and a height variable member capable of changing a position of said contact member in the height direction, said height variable member comprises a regulating member for regulating a position of said contact member in the height direction and a block provided with contact portions having different heights for contacting a part of said regulating member; and a position of said regulating member is variable in the height direction of said regulating member in accordance with a contact position with respect to the contact portion of said block, said contact member is biased to said regulating member by an elastic body and, thereby, said regulating member is biased to the contact portion of said block, said height regulating portion comprises a first guide member to be mounted on the planar position regulating portion for guiding said contact member, and a second guide member provided on the opposite side of said planar position regulating portion of said first guide member, and said contact member is formed with a flange, and said elastic body is provided between the flange of said contact member and said first guide member.

* * * * *